United States Patent
Bala et al.

(10) Patent No.: US 10,014,781 B2
(45) Date of Patent: Jul. 3, 2018

(54) GATE DRIVE SYSTEMS AND METHODS USING WIDE BANDGAP DEVICES

(71) Applicant: ABB Schweiz AG, Baden (CH)

(72) Inventors: Sandeep Bala, Raleigh, NC (US); Eddy Aeloiza, Apex, NC (US); Arun Kadavelugu, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 32 days.

(21) Appl. No.: 15/226,664

(22) Filed: Aug. 2, 2016

(65) Prior Publication Data
US 2018/0041127 A1  Feb. 8, 2018

(51) Int. Cl.
  *H02M 3/24* (2006.01)
  *H02M 3/22* (2006.01)
  *H02M 7/08* (2006.01)

(52) U.S. Cl.
  CPC .............. *H02M 3/24* (2013.01); *H02M 3/22* (2013.01); *H02M 7/08* (2013.01)

(58) Field of Classification Search
  CPC ................................. H02M 3/34; H02M 3/42
  See application file for complete search history.

(56) References Cited

U.S. PATENT DOCUMENTS

| | | | |
|---|---|---|---|
| 4,564,895 A * | 1/1986 | Glennon | H02M 7/487 363/132 |
| 8,866,516 B2 | 9/2014 | Nagai et al. | |
| 8,847,663 B2 | 10/2014 | Nagai et al. | |
| 2004/0070994 A1 * | 4/2004 | Takagi | H02M 3/33592 363/16 |
| 2015/0222263 A1 | 8/2015 | Nagai et al. | |
| 2015/0222264 A1 | 8/2015 | Nagai et al. | |
| 2015/0222306 A1 | 8/2015 | Nagai et al. | |
| 2015/0234417 A1 | 8/2015 | Kawai et al. | |

(Continued)

FOREIGN PATENT DOCUMENTS

WO  WO2015015708 A1  2/2015

OTHER PUBLICATIONS

A. Kadaveluga et al., "Design Considerations and Development of Gate Driver for 15 kV SiC IGBT," IEEE APEC 2014, 8 pgs., Raleigh, North Carolina.

(Continued)

*Primary Examiner* — Jue Zhang
*Assistant Examiner* — Trinh Q Dang
(74) *Attorney, Agent, or Firm* — J. Bruce Schelkopf; Taft Stettinius & Hollister LLP

(57) ABSTRACT

Unique systems, methods, techniques and apparatuses of a gate drive system are disclosed. One exemplary embodiment is a drive circuit electrically coupled to a main switching device including a first inverter, a first inverter controller, an air core transformer, at least one rectifier, at least two smoothing capacitors, a current buffer stage, and a detection circuit. The first inverter controller is structured to operate the first inverter in a first mode and a second mode. The air core transformer is structured to receive the converted AC power from the first inverter. The detection circuit is structured to detect a first mode of the first inverter and a second mode of the first inverter, and operate the current buffer stage based on a detected first mode of the inverter and a detected second mode of the first inverter.

19 Claims, 1 Drawing Sheet

(56) References Cited

U.S. PATENT DOCUMENTS

| | | | | |
|---|---|---|---|---|
| 2015/0270720 A1* | 9/2015 | Takahashi | ............... | H02J 17/00 307/104 |
| 2016/0105129 A1* | 4/2016 | Herriot | ............. | H02M 7/53871 363/132 |
| 2017/0244325 A1* | 8/2017 | Carralero | .......... | H02M 3/33507 |

OTHER PUBLICATIONS

Z. Wang et al., "Design and Implementation of a High-efficiency Three-level Inverter Using GaN HEMTs," PCIM Europe, May 19, 2015, 7 pgs., Nuremburg, Germany.

D. W. Berning et al, "High-voltage Isolated Gate Driver Circuit for 10 kV, 100 A SiC MOSFET/JBS Power Modules," IEEE IAS Annual Meeting, 2008, 7 pgs., Gathersburg, Maryland.

K. S. Muhammad et al., "Magnetically Isolated Gate Driver with Leakage Inductance Immunity," IEEE Transactions on Power Electronics, Apr. 2014, vol. 29, No. 4, 6 pgs.

S. Zeltner, "Insulating IGBT Driver with PCB Integrated Capacitive Coupling Elements," Conference on Integrated Power Electronics Systems, CIPS, Mar. 16, 2010, 6 pgs., Nuremburg, Germany.

B. Wunsch et al, "Inductive Power Transfer for Auxiliary Power of Medium Voltage Converters," IEEE APEC, 2015, pp. 2551-2556, Switzerland.

H. P. Lips, "Gating Systems for High Voltage Thyristor Valves," IEEE Transactions on Power Delivery, Jul. 1988, vol. 3, No. 3, pp. 978-983, Baden, Switzerland.

T. V. Nguyen et al, "Design and Control of a Demagnetization Circuit for Permanent ON OFF Operation in Pulse Transformer Gate Driver," IEEE APEC, 2012, pp. 2472-2479, Grenoble Electrical Engineering Laboratory, Cedex, France.

S. Y. Hui et al, "Coreless Printed Circuit Board (PCB) Transformers for Power MOSFET/IGBT Gate Drive Circuits," IEEE Transactions on Power Electronics, vol. 14, No. 3, pp. 422-430, May 1999.

\* cited by examiner

GATE DRIVE SYSTEMS AND METHODS USING WIDE BANDGAP DEVICES

BACKGROUND

The present disclosure relates generally to gate drive systems. Some switching devices, such as wide bandgap semiconductor switches, are capable of very high switching frequencies, which is beneficial in certain power electronics applications to minimize switching losses. One byproduct of fast switching is the disruption of the gate signal received by the wide bandgap switch due to induced voltage in the gate drive system created by the flow of common mode current through the isolation stages of the gate driver. This disruption is minimized by providing a high impedance path for the common mode currents. Existing gate drive systems suffer from a number of shortcomings and disadvantages. There remain unmet, needs including reducing parasitic coupling capacitance, reducing the number of components, reducing costs, and increasing gate drive system efficiency and capabilities. For instance, some gate drive systems provide only unipolar voltage to a switching device and require multiple isolated paths to operate the gate drive system. There is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY

Exemplary embodiments include unique systems, methods, techniques and apparatuses for gate drive circuits. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
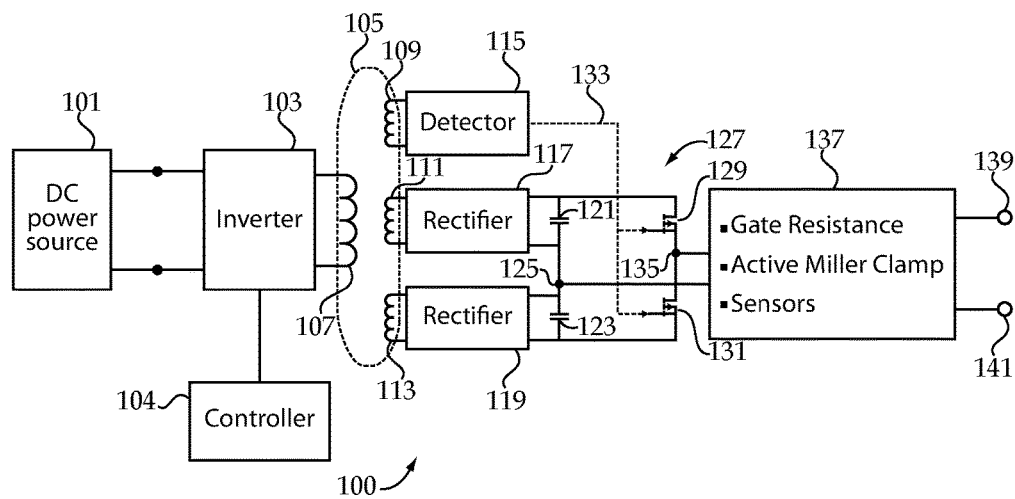
FIG. 1 illustrates an exemplary gate drive system.

With reference to FIG. 1 there is illustrated a gate drive system 100 structured to operate a main switching device by providing a pulse width modulated (PWM) signal with required drive current capability to the main switching device. It shall be appreciated that system 100 may be implemented to drive a number of types of switches, including silicon carbide (SiC) switching devices, gallium nitride (OLIN) switching devices, and other wide bandgap switching devices to name but a few examples.

System 100 includes an inverter 103 electrically coupled to a direct current (DC) power source 101. Inverter 103 is structured to receive DC power from DC power source 101, convert the DC power to an alternating current (AC) power signal, and output the AC power signal. Inverter 103 includes a plurality of switching devices structured to operate with a high switching frequency. The plurality of switching devices of inverter 103 may be wide bandgap switching devices structured to operate with a switching frequency of at least 10 MHz. In certain embodiments, the wide bandgap switching devices are GaN switching devices. In certain embodiments, the plurality of switching devices of inverter 103 are structured to operate with a switching frequency of at least 100 MHz. It shall be appreciated that any or all of the foregoing features of the plurality of switching devices of inverter 103 may also be present in the other switching devices disclosed herein.

In the illustrated embodiment, the plurality of switching devices of inverter 103 may be arranged in a configuration structured to output the AC power signal with at least three voltage levels, such as a neutral point clamped configuration, a flying capacitor configuration, or a cascade configuration. In certain embodiments, inverter 103 is structured to output the AC power signal with two voltage levels or more voltage levels. Inverter 103 may include passive components such that the plurality of switches are operated during zero voltage switching conditions or zero current switching conditions.

System 100 includes an inverter controller 104 electrically coupled to inverter 103 and structured to control the operation of the plurality of switching devices of inverter 103 so as to convert the received DC power to an AC power signal. Controller 104 controls the plurality of switching devices of inverter 103 by transmitting a plurality of activation signals to the plurality of switching devices. As described in more detail below, inverter controller 104 generates activation signals which include a repeating pattern of a first signal component and a second signal component so as to operate inverter 103 in a first mode associated with the first signal component and a second mode associated with the second signal component. In certain embodiments, the pattern begins with the first component and is repeated with a frequency less than or equal to 100 kHz. The first signal component may be structured to operate the plurality of switches of inverter 103 so as to output a zero volt signal. The second signal component may be structured to operate the plurality of switching devices of inverter 103 so as to output a very high frequency (VHF) AC power signal. The frequency of the AC power signal output by inverter 103 using the second component of the activation signals may be greater than or equal to 10 MHz. In other embodiments, the first component and second component are any waveforms distinguishable by a detection circuit 115 described below.

System 100 includes an air core transformer 105, also known as a coreless transformer, electrically coupled to inverter 103 and structured to receive the AC power signal from inverter 103. Specifically, transformer 105 includes a primary winding 107 electrically coupled to inverter 103. Transformer 105 also includes three secondary windings 109, 111, 113 structured to receive the AC power signal from inverter 103 by way of primary winding 107. Air core transformer 105 is structured to provide a low coupling capacitance isolation path between DC power source 101 and the main switching device by way of system 100. For example, transformer 105 may be structured to have a coupling between primary winding 107 and secondary windings 109, 111, and 113 of less than 5 pF.

Rectifier 117 is electrically coupled to secondary winding 111 and is structured to receive the AC power signal from winding 111, convert the AC power signal to DC power, and output the DC power. In certain embodiments, rectifier 117 includes passive components, such as diodes, arranged in a topology so as to convert the received AC power signal to DC power. In certain embodiments, rectifier 117 includes active components controlled by a rectifier controller so as to convert the AC power signal to DC power. It shall be appreciated that any or all of the foregoing features of rectifier 117 may also be present in the other rectifiers disclosed herein. A capacitor 121 is electrically coupled in parallel to rectifier 117 and structured to reduce or eliminate transients in the DC power output by rectifier 117.

Rectifier 119 is electrically coupled to secondary winding 113 and structured to receive the AC power signal from winding 113, convert the received AC power signal to DC power, and output the converted DC power. A capacitor 123 is electrically coupled parallel to rectifier 119 and structured to reduce or eliminate transients in the DC power output by rectifier 119. Capacitor 123 is electrically coupled in series with capacitor 121 at a reference voltage point 125. System 100 may be structured such that the voltages across capacitors 121 and 123 are unequal. For example, the voltage across capacitor 121 may be 20 V while the voltage across capacitor 123 is 5V. In certain embodiments, system 100 includes additional rectifiers electrically coupled to additional secondary windings similar to the configuration of rectifier 117 and 119.

In certain embodiments, system 100 includes additional capacitors structured to facilitate resonant coupling between primary winding 107 and secondary windings 109, 111, and 113. The additional capacitors may be electrically coupled in parallel between inverter 103 and primary winding 107, between secondary winding 109 and detection circuit 115, between secondary winding 111 and rectifier 117, and between secondary winding 113 and rectifier 119. The additional capacitors are sized such that the resonant frequency is equal to the switching frequency of the plurality of switching devices of inverter 103.

Capacitors 121 and 123 are electrically coupled in parallel to a current buffer stage 127, such as a totem pole, which includes switching devices 129 and 131 electrically coupled together in series at an output node 135. Output node 135 and reference voltage point 125 are electrically coupled to the main switching device to be operated by system 100. In the illustrated embodiment, output node 135 and reference voltage point 125 are electrically coupled to a gate terminal 139 structured to be electrically coupled to the gate of the main switching device and a source terminal 141 structured to be electrically coupled to the source of the main switching device. In certain embodiments, system 100 is electrically coupled to the gate of the main switching device or the source of the main switching device.

Current buffer stage 127 is controlled by detection circuit 115 so as to receive DC power from rectifiers 117 and 119, convert the DC power to a PWM signal with a bipolar output voltage, and provided the converted power to the main switching device. The PWM signal with the bipolar output voltage includes a positive output voltage during certain periods of time and a negative output voltage during other periods of time. The PWM signal with the bipolar output voltage may include more than one positive output voltage magnitudes or more than one negative output voltage magnitudes.

In the illustrated embodiment, output node 135 and reference voltage point 125 are electrically coupled to gate terminal 139 and source terminal 141 by way of an auxiliary circuit 137 which includes gate resistance, an active miller clamp, and protection against short circuits. In other embodiments, output node 135 and reference voltage point 125 may be directly electrically coupled to gate terminal 139 and source terminal 141 or electrically coupled by way of one or more of the devices of auxiliary circuit 137.

A detection circuit 115 including a demodulator is electrically coupled to secondary winding 109 and structured to receive the AC power signal from secondary winding 109, sample the AC power signal, generate at least one activation signal using the AC power signal samples, and transmit the at least one activation signal to switching devices 129 and 131. In certain embodiments, detection circuit 115 is structured to generate and transmit a low activation signal while detecting the first component of the AC power signal associated with the first component of the plurality of activation signals transmitted to inverter 103 with controller 104 and transmit a high activation signal while detecting a first component of the AC power signal associated with the first component of the plurality of activation signals transmitted to inverter 103 with controller 104. The frequency of the activation signal generated by detection circuit 115 may be less than or equal to 100 kHz. In certain embodiments, the detection circuit detects the transition between the first component of the AC power signal and the second component of the AC power signal within one carrier cycle, approximately 10-100 ns.

Figures 2A, 2B, 2C:
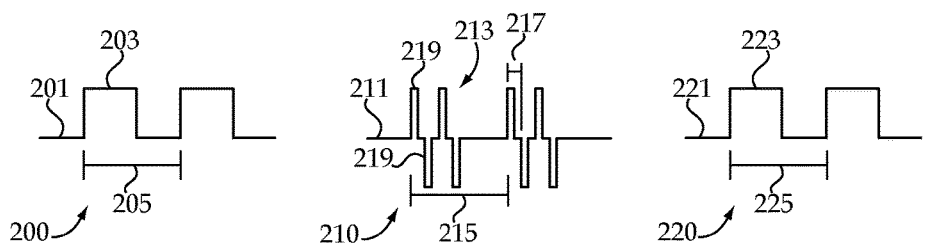
FIGS. 2A through 2C are graphs illustrating signals generated with the exemplary gate drive system in FIG. 1.

With reference to FIG. 2A there is illustrated an activation signal 200 generated by inverter controller 104 of system 100 in FIG. 1. Signal 200 includes a first component 201 and a second component 203. First component 201 is structured as a low signal. Second component 203 is structured as a high signal. When inverter 103 receives first component 203 of activation signal 200, the plurality of switching devices are structured to generate a 0 V signal. When inverter 103 receives second component 203 of activation signal 200, the plurality of switching devices are structured to generate the AC power signal with a high frequency. For example, the AC power signal may have a frequency of at least 10 MHz. In other embodiments, second component 203 includes a series of electric pulses structured to operate the plurality of switching devices of inverter 103 so as to generate the second component of the AC power signal. A time period 205 includes the time period of first component 201 and second component 203 of activation signal 200. In certain embodiments, time period 205 is equal to or greater than 10 microseconds. In certain embodiments, the frequency of signal 200 is less than 100 kHz.

With reference to FIG. 2B there is illustrated an AC power signal 210 generated with inverter 103 of system 100 in FIG. 1. Signal 210 includes a first component 211 and a second component 213. First component 211 corresponds to the first component 201 in FIG. 2A and second component 213 corresponds to the second component 203 in FIG. 2A. A time period 215 includes one first component 211 and one second component 213 of signal 210. It is important to note the length of time period 215 is equal to the length of time period 205. Second component 213 includes a series of power pulses 219. In certain embodiments, the frequency of the power pulses 219 is at least 10 MHz.

With reference to FIG. 2C there is illustrated an activation signal 220 generated by detection circuit 115 of system 100 in FIG. 1. Activation signal 220 includes a first component 221 and a second component 223. First component 221 corresponds to first component 211 of AC power signal 215 in FIG. 2B and first component 201 of activation signal 200 in FIG. 2A. Second component 223 corresponds to second component 213 of AC power signal 215 in FIG. 2B and second component 203 of activation signal 200 in FIG. 2A. A time period 225 of signal 220 includes the time period of one first component 221 and the time period of one second component 223. As with time periods 205 and 215, in certain embodiments, the length of time period 225 greater than or equal to 10 microseconds.

Further written description of a number of exemplary embodiments shall now be provided. One embodiment is a gate drive system structured to be operatively coupled to a main switching device comprising; an inverter including a plurality of inverter switching devices; an inverter controller structured to generate a plurality of inverter activation signals structured to operate the inverter switching devices so as to receive DC power, convert the received DC power to an AC power signal, and output the AC power signal; an air core transformer including a primary winding electrically coupled to the inverter so as to receive the AC power signal from the inverter, a first secondary winding and a second secondary winding; a rectifier electrically coupled to the first secondary winding and structured to receive the AC power signal from the first secondary winding and convert the received AC power signal to DC power; two capacitors electrically coupled together at a reference voltage point and the rectifier electrically coupled in parallel to at least one of the two capacitors such that at least one of the two capacitors receives DC power from the rectifier; a current buffer stage electrically coupled in parallel to the two capacitors, including an output node, and structured to receive DC power from the two capacitors, convert the DC power to the PWM signal with a bipolar voltage, and output the PWM signal with the bipolar output voltage; and a detection circuit electrically coupled to the second secondary winding and structured to receive the AC power signal from the first secondary winding, sample the received AC power signal, generate at least one current buffer stage activation, signal using the AC power samples, and transmit the at least one current buffer stage activation signal to the current buffer stage.

In certain forms of the foregoing system, the gate drive systems comprises a second rectifier, wherein one of the two capacitors is electrically coupled in parallel to the rectifier and the other capacitor is electrically coupled in parallel to the second rectifier. In certain forms, the AC power signal includes a repeating pattern of a first component and a second component, wherein the first component is an AC signal with a frequency greater than 300 kHz. In certain forms, the second component of the AC power signal is a zero voltage signal. In certain forms, the repeating pattern of the first component and the second component is structured such that the frequency of the repeating pattern is at, most 100 kHz. In certain forms, the detection circuit is structured to detect the repeating pattern of the first component of the AC power signal and the second component of the AC power signal, and generate the at least one current buffer stage activation signal using the detected repeating pattern. In certain forms, the output node and reference voltage point are electrically coupled to a gate and a source of the main switching device such that the main switching device receives the PWM signal with the bipolar output voltage from the current buffer stage.

Another exemplary embodiment is a drive circuit electrically coupled to a main switching device comprising; an inverter including a plurality of switching devices; an inverter controller structured to operate the inverter in a first mode and a second mode so as to receive DC power, convert the DC power to AC power, and output the AC power; an air core transformer structured to receive the converted AC power from the inverter; at least one rectifier structured to receive AC power from the air core transformer, convert the AC power to DC power, and output the DC power; at least two smoothing capacitors electrically coupled with the at least one rectifier and electrically coupled at a reference voltage point; a current buffer stage including an output node, electrically coupled in parallel to the smoothing capacitors, and structured to receive DC power from the at least one rectifier; and a detection circuit structured to detect a first mode of the inverter and a second mode of the inverter and operate the current buffer stage based on the detected first mode of the inverter and the detected second mode of the inverter.

In certain forms of the foregoing drive circuit, the plurality of switching devices of the inverter are gallium nitride (GaN) switching devices. In certain forms, the inverter being operated in the first mode is structured to generate AC power with a frequency greater than 300 kHz. In certain forms, the inverter controller is structured to operate the inverter in a repeating pattern of the first mode and the second mode, the repeating pattern having a frequency less than or equal to 100 kHz. In certain forms, the main switching device is a silicon carbide switching device. In certain forms, the reference voltage point and the output node are electrically coupled to the main switching device. In certain forms, the reference voltage point and the output node are electrically coupled to the main switching device by way of at least one of a gate resistance, an active miller clamp, and a sensor. In certain forms, the sensor is structured to measure electrical characteristics of the gate circuit and provide the measurements to the inverter controller, and wherein the inverter controller is structured to operate the inverter using the measurements received from the sensor. In certain forms, the drive circuit comprises a resonant capacitor electrically coupled between at least one of the inverter and the air core transformer, between at least one rectifier and the air core transformer, and between the detection circuit and the air core transformer, the resonant capacitor structured such that the inverter is resonantly coupled to the at least one rectifier during gate circuit operation.

A further exemplary embodiment is a method for operating a switching device: converting DC power to an AC power signal with a first converter, the AC power signal including a combined pattern comprising a first component and a second component; providing the AC power signal to an air core transformer; receiving, with a rectifier, the AC power signal from the air core transformer; converting the AC power signal received from the air core transformer to DC power using the rectifier; sampling the AC power signal; generating an activation signal using the sampling of the AC power signal; generating a PWM signal with bipolar output voltage using the second converter, the activation signal, and the DC power from the rectifier; and providing the PWM signal to a gate of the switching device.

In certain forms of the foregoing method, the first component of the AC power signal is a 0V signal and the second component is an AC signal with a frequency of at least 10 Mhz. In certain forms, converting the DC power from the rectifier to an AC output includes: detecting a first component of the AC power signal using the samples; detecting a second component of the AC power signal using the samples; and toggling the switches of the second converter in response to detecting a transition from the first component to the second component of the AC power signal. In certain forms, the method comprises providing the bipolar output voltage power converted with the converter to a source of the switching device.

It is contemplated that the various aspects, features, processes, and operations from the various embodiments may be used in any of the other embodiments unless expressly stated to the contrary. Certain operations illustrated may be implemented by a computer executing a computer program product on a non-transient computer readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "electrically coupled to," "electrically coupled with" and the like include indirect connection and, coupling and further include but do not require a direct coupling or connection unless expressly indicated to the contrary. When the language "at least a portion" and/or "a portion" is used the item can include a portion and or the entire item unless specifically stated to the contrary.

What is claimed is:

1. A gate drive system structured to be operatively coupled to a main switching device comprising:
   an inverter including a plurality of inverter switching devices;
   an inverter controller structured to generate a plurality of inverter activation signals structured to operate the inverter switching devices so as to receive DC power, convert the received DC power to an AC power signal, and output the AC power signal;
   an air core transformer including a primary winding electrically coupled to the inverter so as to receive the AC power signal from the inverter, a first secondary winding, and a second secondary winding;
   a rectifier electrically coupled to the first secondary winding and structured to receive the AC power signal from the first secondary winding and convert the received AC power signal to DC power;
   two capacitors electrically coupled together at a reference voltage point and the rectifier electrically coupled in parallel to at least one of the two capacitors and such that at least one of the two capacitors receives DC power from the rectifier;
   a current buffer stage electrically coupled in parallel to the two capacitors, including an output node, and structured to receive DC power from the two capacitors, convert the DC power to a PWM signal including a bipolar output voltage, and output the PWM; and
   a detection circuit electrically coupled to the second secondary winding and structured to receive the AC power signal from the first secondary winding, sample the received AC power signal, generate at least one current buffer stage activation signal using the AC power samples, and transmit the at least one current buffer stage activation signal to the current buffer stage.

2. The gate drive system of claim 1 comprising a second rectifier, wherein one of the two capacitors is electrically coupled in parallel to the rectifier and the other capacitor is electrically coupled in parallel to the second rectifier.

3. The gate drive system of claim 1 wherein the AC power signal includes a repeating pattern of a first component and a second component, wherein the first component is an AC signal with a frequency greater than 300 kHz.

4. The gate drive system of claim 1, wherein the output node and reference voltage point are electrically coupled to a gate and a source of the main switching device such that the main switching device receives a PWM signal with bipolar output voltage from the current buffer stage.

5. The gate drive system of claim 3 wherein the second component of the AC power signal is a zero voltage signal.

6. The gate drive system of claim 3 wherein the repeating pattern of the first component and the second component is structured such that the frequency of the repeating pattern is at most 100 kHz.

7. The gate drive system of claim 3 wherein the detection circuit is structured to detect the repeating pattern of the first component of the AC power signal and the second component of the AC power signal, and generate the at least one current buffer stage activation signal using the detected repeating pattern.

8. A drive circuit electrically coupled to a main switching device comprising:
   an inverter including a plurality of switching devices;
   an inverter controller structured to operate the inverter in a first mode and a second mode so as to receive DC power, convert the DC power to AC power, and output the AC power;
   an air core transformer structured to receive the converted AC power from the inverter;
   at least one rectifier structured to receive AC power from the air core transformer, convert the AC power to DC power, and output the DC power;
   at least two smoothing capacitors electrically coupled with the at least one rectifier and electrically coupled at a reference voltage point;
   a current buffer stage including an output node, electrically coupled in parallel to the smoothing capacitors, and structured to receive DC power from the at least one rectifier; and
   a detection circuit structured to detect a first mode of the inverter and a second mode of the inverter and operate the current buffer stage based on the detected first mode of the inverter and the detected second mode of the inverter.

9. The drive circuit of claim 8 wherein the plurality of switching devices of the inverter are gallium nitride (GaN) switching devices.

10. The drive circuit of claim 8 wherein the inverter being operated in the first mode is structured to generate AC power with a frequency greater than 300 kHz.

11. The drive circuit of claim 8 wherein the inverter controller is structured to operate the inverter in a repeating pattern of the first mode and the second mode, the repeating pattern having a frequency less than or equal to 100 kHz.

12. The drive circuit of claim 8 wherein the main switching device is a silicon carbide switching device.

13. The drive circuit of claim 8 wherein the reference voltage point and the output node are electrically coupled to the main switching device.

14. The drive circuit of claim 8 comprising a resonant capacitor electrically coupled between at least one of the inverter and the air core transformer, between at least one rectifier and the air core transformer, and between the detection circuit and the air core transformer, the resonant capacitor structured such that the inverter is resonantly coupled to the at least one rectifier during gate circuit operation.

15. The drive circuit of claim 13 wherein the reference voltage point and the output node are electrically coupled to the main switching device by way of at least one of a gate resistance, an active miller clamp, and a sensor.

16. The drive circuit of claim 15 wherein the sensor is structured to measure electrical characteristics of the gate circuit and provide the measurements to the inverter controller, and wherein the inverter controller is structured to operate the inverter using the measurements received from the sensor.

17. A method for operating a switching device comprising:
    converting DC power to an AC power signal with a first converter, the AC power signal including a combined pattern comprising a first component and a second component;
    providing the AC power signal to an air core transformer;
    receiving, with a rectifier, the AC power signal from the air core transformer;
    converting the AC power signal received from the air core transformer to DC power using the rectifier;
    sampling the AC power signal;
    detecting the first component and the second component using the AC power signal samples;
    generating an activation signal structured to toggle a set of switches of a second converter in response to detecting a transition from the first component to the second component;
    generating a PWM signal including bipolar output voltage using the second converter, the activation signal, and the DC power from the rectifier; and
    providing the PWM signal to a gate of the switching device.

18. The method of claim 17 wherein the first component of the AC power signal is a 0V signal and the second component is an AC signal with a frequency of at least 10 Mhz.

19. The method of claim 17 comprising providing the PWM signal with bipolar output voltage generated with the current buffer stage to a source of the switching device.

\* \* \* \* \*